United States Patent [19]

Kumagai

[11] 4,205,272
[45] May 27, 1980

[54] PHASE-LOCKED LOOP CIRCUIT FOR USE IN SYNTHESIZER TUNER AND SYNTHESIZER TUNER INCORPORATING SAME

[75] Inventor: Morio Kumagai, Tokyo, Japan

[73] Assignee: Trio Kabushiki Kaisha, Tokyo, Japan

[21] Appl. No.: 896,148

[22] Filed: Apr. 13, 1978

[30] Foreign Application Priority Data

| Apr. 13, 1977 [JP] | Japan | 52-41489 |
| Apr. 13, 1977 [JP] | Japan | 52-41490 |
| Apr. 13, 1977 [JP] | Japan | 52-41491 |
| Apr. 13, 1977 [JP] | Japan | 52-41492 |
| Apr. 13, 1977 [JP] | Japan | 52-41493 |

[51] Int. Cl.² .................................................. H04B 1/06
[52] U.S. Cl. ........................................ 455/83; 331/11; 331/1 A; 455/260
[58] Field of Search ............... 325/417, 420–421, 325/453, 464, 468, 419; 331/1 A, 18, 25, 10, 11, 17

[56] References Cited

U.S. PATENT DOCUMENTS

| 3,375,448 | 3/1968 | Newman et al. | 331/18 |
| 3,496,473 | 2/1970 | Seppeler et al. | 325/453 |
| 3,660,781 | 5/1972 | Tewksbury et al. | 331/11 |
| 3,703,686 | 11/1972 | Hekimian | 331/11 |
| 3,753,141 | 8/1973 | Van Elk et al. | 331/18 |
| 3,845,393 | 10/1974 | Basset | 325/453 |
| 3,909,735 | 9/1975 | Anderson et al. | 325/419 |

*Primary Examiner*—Robert L. Griffin
*Assistant Examiner*—Alexander Gerasimow
*Attorney, Agent, or Firm*—Gerald J. Ferguson, Jr.; Joseph J. Baker

[57] ABSTRACT

A phase-locked loop (PLL) circuit and a synthesizer tuner incorporating the PLL circuit where a second DC control signal is applied to the PLL voltage controlled oscillator to reduce the phase error output signal from the PLL phase detector to near zero volts and thereby improve the performance of the voltage controlled oscillator and the S/N ratio of the tuner. Various circuits are disclosed for deriving the above second DC control signal. Further improvement in the S/N ratio is effected by switching in a narrow capture range for the PLL circuit when the desired signal is received and when the PLL phase detector output is operated near zero volts. Also when the station is changed, detuning is detected to switch in a broader capture range.

24 Claims, 5 Drawing Figures

4,205,272

PHASE-LOCKED LOOP CIRCUIT FOR USE IN SYNTHESIZER TUNER AND SYNTHESIZER TUNER INCORPORATING SAME

BACKGROUND OF THE INVENTION

This invention is directed to an improved phase-locked loop circuit (PLL) that may be used with a synthesizer tuner or the like.

Recently, phase-locked loop circuits (PLL hereafter) have been widely used for synthesizer tuners, etc. However, even when the loop is in a locked state, there is no ideal stable state in the PLL. Thus, phase error voltage is constantly outputted from the phase sensitive detector of the PLL and since it is not completely integrated by the following low-pass filter, some ripple components remain which frequency-modulate the voltge controlled oscillator. This becomes severe when the phase difference between the standard oscillation frequency applied to the phase sensitive detector and the n-divided frequency of the voltage controlled oscillator being compared is large and it deteriorates the performance of the voltage controlled oscillator. In a synthesizer tuner where the size of the phase error voltage depends on the station selected with the receiving band, the S/N fluctuates at each point within the band. Although it is possible to enhance the low pass filter to thereby permit removal of the ripple components, this approach is limited since it causes delayed loop responses and disconnected lock at times.

Further, an improvement in the S/N ratio of a synthesizer tuner may be effected by narrowing the capture range of the PLL circuit low-pass filter. However, when the phase error voltage of the phase sensitive detector of PLL circuit changes, there is a risk that the lock may come off due to the narrow capture range.

SUMMARY OF THE INVENTIONS

In view of the above-mentioned problems, primary purposes of this invention are to provide a phase-locked loop circuit that can improve the performance of the PLL voltage controlled oscillator, and when used for a synthesizer tuner, can improve the S/N in the entire range of the receiving band.

It is a further primary purpose of this invention to provide a synthesizer tuner having an improved S/N ratio where the tendency for the lock to come off is lessened when a narrow capture range is selected for the PLL low-pass filter.

Other objects and advantages of this invention will be apparent from a reading of the following specification and claims taken with the drawing.

DETAILED DESCRIPTION OF PREFERRED EMBODIMENTS

Figure 1:
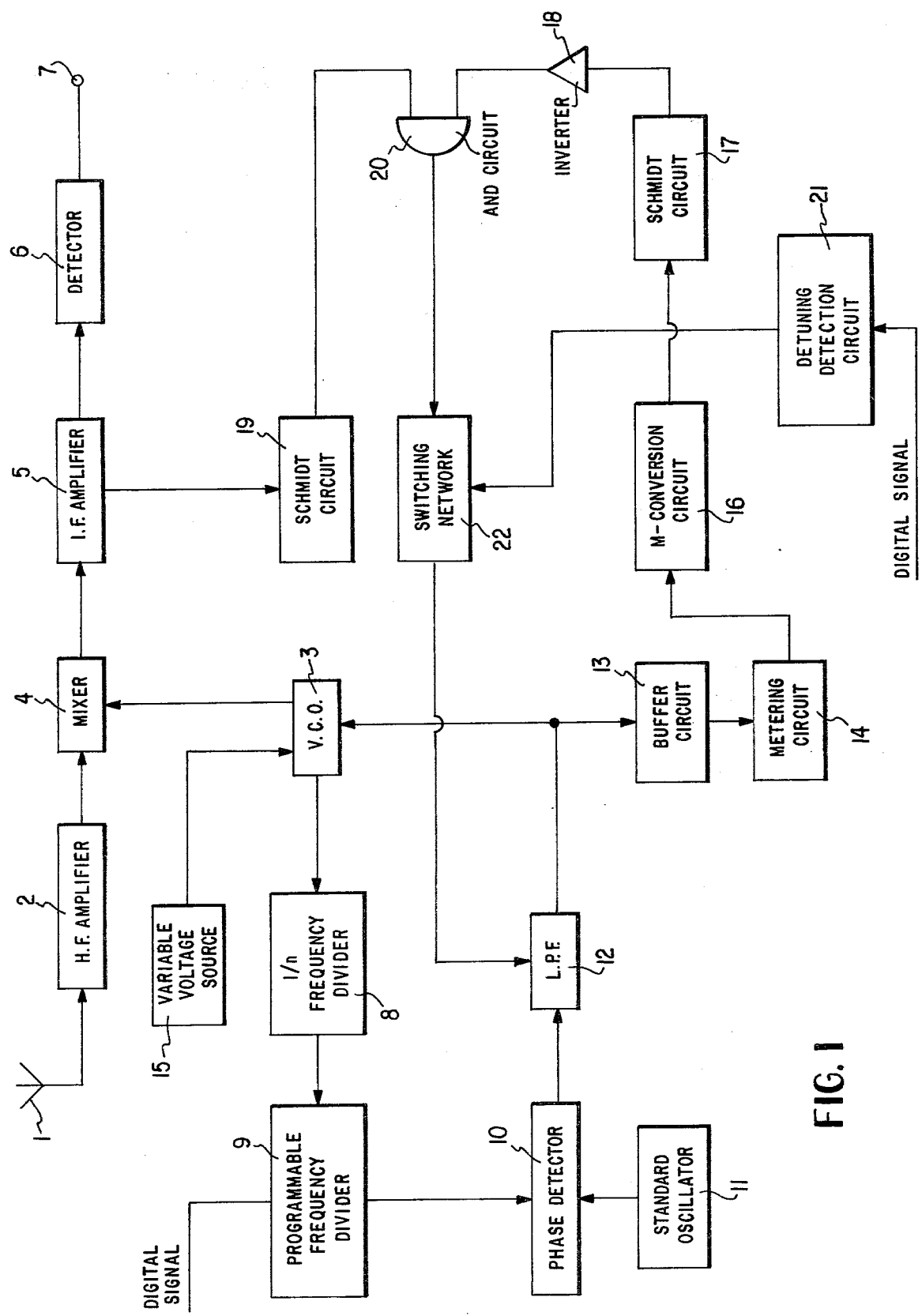
FIG. 1 is a block diagram of an illustrative synthesizer tuner having a phase-locked loop circuit (PLL) in accordance with this invention.

Reference should be made to the drawing where like reference numerals refer to like parts.

In FIG. 1, 1 is an antenna; 2 is a high frequency amplifier that provides high frequency amplification to the signals received by antenna 1; 3 is a voltage controlled oscillator, the oscillation frequency of which is controlled by changing the DC voltage applied to a variable frequency element such as a varactor as will be discussed in more detail hereinafter; 4 is a frequency converter that converts the output signals of high frequency amplifier 2 to an intermediate frequency in accordance with the output from the voltage controlled oscillator; 5 is an intermediate frequency amplifier that amplifies the output signals of frequency converter 4; 6 is a wave detector that detects the output signals of intermediate frequency amplifier 5; and 7 is the output terminal to which the output signals of detector 6 are applied.

8 is a 1/n frequency divider that divides the frequency of the output of voltage controlled oscillator 3 by n; 9 is a programmable frequency divider that divides the output frequency of the 1/n frequency divider 8, the frequency dividing ratio of which can be controlled in accordance with a multiple digit, digital signal applied thereto so that it can typically change the oscillation frequency of voltage controlled oscillator 3 generally at every 100 KHz; 10 is a phase sensitive detector that detects the phase difference between the output frequency of programmable frequency divider 9 and the standard frequency output of a standard oscillator 11 and generates a phase error voltage corresponding to the phase difference; and 12 is a low-pass filter that generates a DC voltage by removing the unnecessary high frequency components from the phase error voltage. This DC voltage is applied to the variable frequency element of voltage controlled oscillator 3. Thus, the basic phase-locked loop circuit (PLL) includes voltage controlled oscillator 3 and 1/n frequency divider 8 through low-pass filter 12.

Low-pass filter 12 may have two paths as will be discussed in more detail hereinafter so that the capture range can be changed to either a narrow capture range or a wide capture range. Further, connected to the PLL circuit are a buffer circuit 13, a metering circuit 14, and a variable voltage source 15. The buffer circuit extracts the DC output voltage of low-pass filter 12 with minimal loading of the PLL circuit. Metering circuit 14 deflects with the DC output voltage of buffer circuit 13, the meter typically being zero volts at its center indication as will be discussed below. Variable voltage source 15 is manually operable and controls the phase of the oscillation frequency of voltage controlled oscillator 3.

16 is an M-conversion circuit that is responsive to bipolar, DC voltage changes of positive and negative polarity in the output of metering circuit 14 to provide a DC voltage, the changes of which are unipolar; 17 is a Schmidt circuit which shapes the waveform of the DC output voltage of M-conversion circuit 16; 18 is an inverter that inverts the polarity of the output signals of Schmidt circuit 17; 19 is a Schmidt circuit that shapes the waveform of the intermediate frequency signals (IF signals) of intermediate frequency amplifier 5 when desired signals are received; and 20 is an AND circuit that takes the logical products of the output signals of Schmidt circuit 19 and inverter 18. Further, 21 is a detuning detection circuit that detects the occurrence of detuning by detecting changes in the least significant digit of the digital signals that control the frequency dividing ratio of programmable frequency divider 9 and 22 is a switching network that switches low-pass filter 12—that is, the capture range in accordance with the output signals of AND circuit 20 and detuning detection circuit 21.

Figure 2:
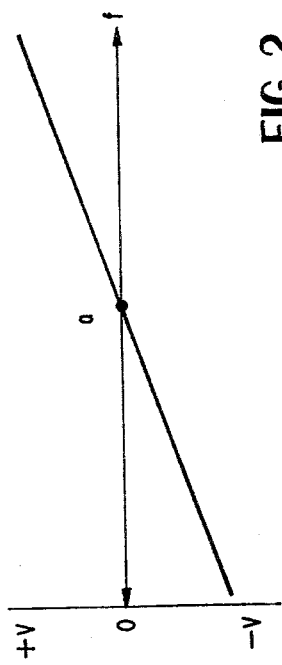
FIG. 2 is a graph of an illustrative DC voltage output from the PLL circuit low-pass filter over the receiving band of the synthesizer tuner.

When the PLL circuit of this invention is employed in a synthesizer tuner, the free-running frequency of voltage controlled oscillator 3 is so set that the phase error output voltage of phase sensitive detector 10, that is the DC output voltage of low-pass filter 12 is preferably zero volts usually near the center of the receiving band, which corresponds to point "a" in the graph of FIG. 2 of the DC output voltage of filter 12 in the receiving band. It is not essential that the zero volt point be near the center; however, a zero voltage point near the center is employed for convenience of explanation. By controlling the frequency dividing ratio of programmable frequency divider 9 with the digital control signals, the oscillation frequency of voltage controlled oscillator 3 is controlled in a positive or negative direction from point "a" whereby the reception frequency of the synthesizer tuner is controlled. However, when the oscillation frequency is controlled in this manner, the output phase error voltage of phase sensitive detector 10, that is the DC output voltage of low-pass filter 12, increases in the positive or negative direction, and a ripple component that cannot be integrated by low-pass filter 12 also increases correspondingly to undesirably frequency modulate oscillator 3. This becomes one cause of S/N deterioration in the synthesizer tuner.

Figure 3:
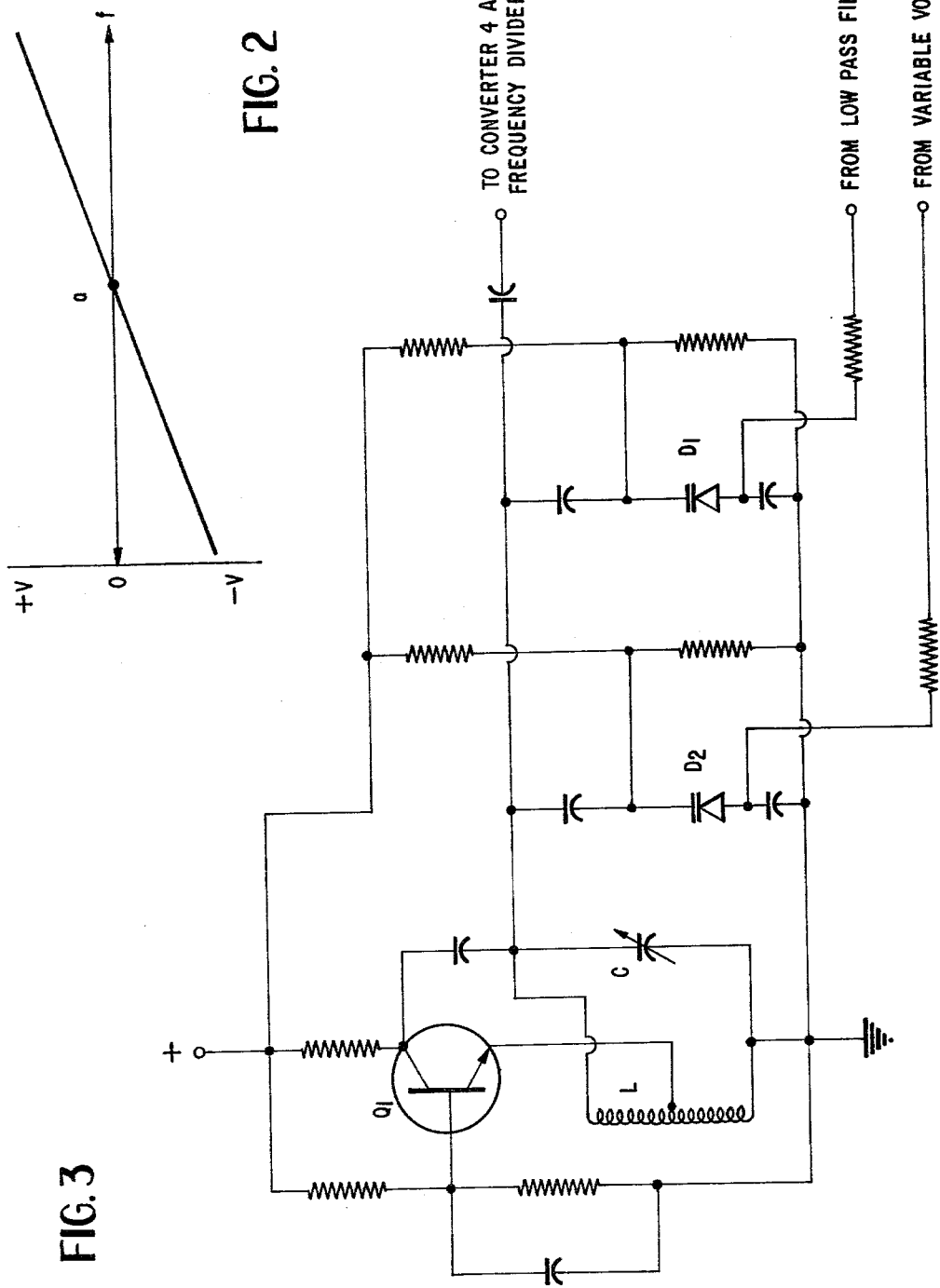
FIG. 3 is a circuit diagram of an illustrative voltage controlled oscillator for use in the PLL circuit of FIG. 1.

Therefore, in accordance with one aspect of this invention, the DC voltage extracted from the output of low-pass filter 12 by buffer circuit 13 is applied to metering circuit 14 where the metering circuit deflects the meter with the DC output voltage of buffer circuit 13 where the meter is zero volts at its center indication. Further, manually operable variable voltage source 15 controls the oscillation frequency phase of voltage controlled oscillator 3 by varying the DC voltage supplied to a variable frequency element of voltage control oscillator 3 by manual operation of variable voltage source 15. As shown in FIG. 3, the frequency variable element is preferably different from the frequency variable element supplied with the DC output voltage of low-pass filter 12; however, they may be the same element. When the same element is used, care must be taken not to influence the PLL characteristics. A typical voltage-controlled oscillator circuit for use as oscillator 3 is shown in FIG. 3. A common-base Hartley circuit may be used. Oscillator frequency is determined by tank circuit L-C, across a portion of which is placed variable capacitance (varactor) diodes $D_1$ and $D_2$. These reverse-biased diodes act as capacitance whose value varies in proportion to the DC voltage across it where diode $D_1$ is connected to low-pass filter 12 and $D_2$ is connected to variable voltage source 15. By properly controlling these voltages, the resonant frequency of the oscillator can be varied and, in particular, the output phase can be controlled by source 15. Diode control voltages may be brought in through resistances for circuit isolation.

Thus, in accordance with the foregoing aspect of the invention, the DC output voltage of low-pass filter 12 (that is, the output phase error voltage of phase sensitive detector 10) is indicated by the meter of the metering circuit 14. When the meter is deflecting while the desired signals are being received, the voltage variable circuit 15 may be manually operated so that the deflection of the meter becomes zero volts. Hence, by controlling the oscillation frequency phase of voltage controlled oscillator 3 with variable voltage source 15 to thereby reduce the phase difference between the two signals applied to phase sensitive detector 10, the output phase error voltage of the phase sensitive detector 10 (that is, the DC output voltage of low-pass filter 12), is brought near zero volts. By doing so, the output ripple component of low-pass filter 12 is reduced and the S/N is accordingly improved.

Therefore, by using a synthesizer tuner of the above type when the meter in the metering circuit 14 is deflecting while desired signals are being received, the S/N during this time can be improved by manually operating the variable voltage source 15 so that the deflection of the meter becomes zero volts. By performing this operation each time new signals are received, the S/N can be substantially improved in the entire range of the receiving band. The foregoing improvement is effected by simply zeroing the meter of circuit 14. Additional improvement can be effected by switching in a more narrow capture band at filter 12, which will now be described.

As stated above, the PLL circuit can control the oscillation frequency of voltage controlled oscillator 3 by changing the frequency dividing ratio of programmable frequency divider 9 with digital signals, and by controlling this oscillation frequency, the receiving frequency of the synthesizer tuner changes. In addition, in this PLL circuit, the phase of the oscillation frequency of the voltage controlled oscillator 3 can be controlled by manually operating variable voltage source 15. Therefore, when the oscillation frequency of voltage controlled oscillator 3 is varied (from the free-running frequency to the positive or negative direction) as described above, a phase error voltage is generated in the output of phase sensitive detector 10. However, by controlling the phase of the oscillation frequency of voltage controlled oscillator 3 by manual operation of the voltage variable circuit 15, the phase difference between the two input signals to phase sensitive detector 10 can be reduced, and the phase error voltage can be controlled at about zero volts. In this case, the DC voltage generated from low-pass filter 12 with the phase error voltage as an input is indicated by the meter in metering circuit 14. Therefore, variable voltage source 15 is manually operated so that the meter deflection becomes zero volts whereby the phase error voltage is controlled at about zero volts. And, if this operation is performed each time the oscillation frequency of voltage controlled oscillator 3 is changed and the receiving frequency is changed, the phase error voltage can be controlled at about zero volts in the entire range of the receiving band. Thus, in effect, it is performed when desired signals are received.

When the desired signals are received, IF signals are outputted from intermediate frequency amplifier 5, and applied to AND circuit 20 as "1" signals by way of Schmidt circuit 19. When the phase error voltage is controlled at about zero volts as described above, the DC voltage outputted from metering circuit 14 is near zero volts. Thus, "1" signals are supplied to AND circuit 20 by way of M-conversion circuit 16, Schmidt circuit 17, and inverter 18 as well. Hence, when desired signals are received and the phase error voltage is controlled at about a predetermined value such as zero, the logic of AND circuit 20 is established and "1" signals are outputted from AND circuit 20 to switching network 22. As a result, low-pass filter 12 is switched to the narrower side of the capture range by the switching network 22, as will be described in more detail hereinafter. Since the phase error voltage is controlled at about zero volts, the lock of the PLL circuit does not disconnect even when the capture range becomes narrow.

When detuning occurs by changing the oscillation frequency of voltage controlled oscillator 3 by changing the frequency dividing ratio of programmable frequency divider 9, this detuning is detected by the detuning detection circuit 21 by the changes of the least significant digit of the digital control signal for divider 9. And, when detuning is detected by detuning detection circuit 21, a control signal therefrom circuit 21 is applied to switching network 22, which, in response to the control signal, switches low-pass filter 12 to the broader capture range. This switching state continues until "1" signals are again applied from AND circuit 20.

In a synthesizer tuner of the type described above, the detection circuits for the reception of desired signals and the control at zero volts are comprised of M-conversion circuit 16, Schmidt circuit 17, inverter 18, Schmidt circuit 19, the AND circuit 20. However, these detection circuits may be comprised of other than the above-mentioned circuits.

In summary with respect to the embodiment of FIG. 1, the phase error voltage can be controlled by manual operation at about zero volts in the entire range of the receiving band and low-pass filter 12 (that is, the capture range) can be switched automatically to a narrower range when desired signals are being received and when the phase error voltage is at about zero. Thus, without the concern for the lock being disconnected, S/N can be substantially improved.

Figure 4:
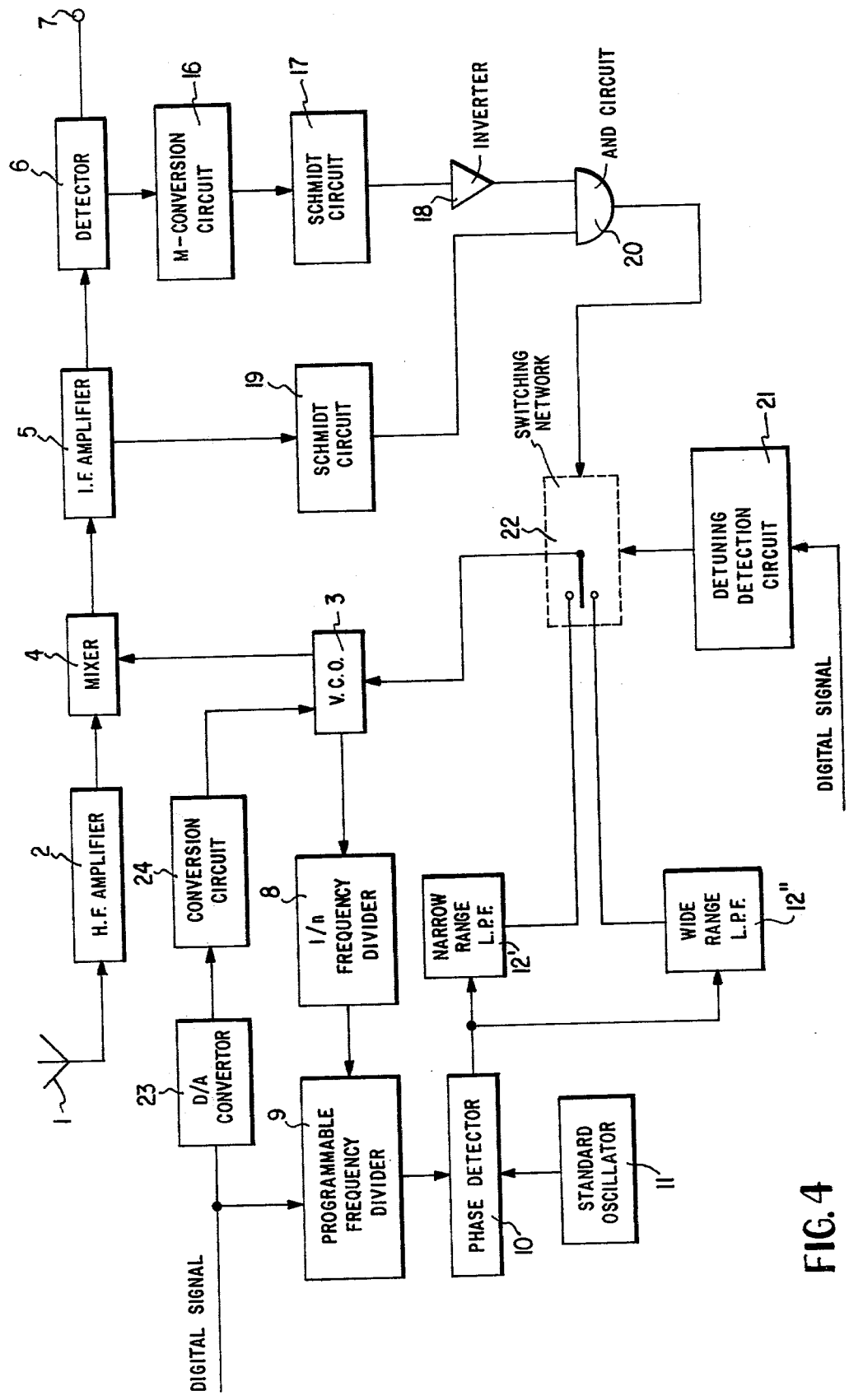
FIGS. 4 and 5 are block diagrams of other illustrative embodiments of the invention.

In FIG. 4, rather than the manual control 15, automatic control is provided by a D/A converter 23 and a conversion circuit 24. D/A converter 23 converts the digital signals for changing the frequency dividing ratio of programmable frequency divider 9 to an analog voltage. The conversion circuit 24 converts the analog voltage to match the input voltage versus output frequency characteristic curve of voltage controlled oscillator 3 which is known in advance. The output voltage is applied to the variable frequency element of voltage controlled oscillator 3 in order to control the phase of the oscillation frequency thereof.

Schmidt circuit 19 shapes the waveform of the IF signals outputted from intermediate frequency amplifier 5. M-conversion circuit 16 changes the DC output voltage changes of positive and negative polarity of FM detector 6 to unipolar DC voltage changes. Schmidt circuit 17 shapes the waveform of the DC output voltage of M-conversion circuit 16 and inverter 18 inverts the polarity of the output signals of Schmidt circuit 17. AND circuit 20 takes the logical product of the output signals from Schmidt circuit 19 and inverter 18. Further, detuning detection circuit 21 detects detuning by detecting changes of the least significant digit of the digital signal that controls the frequency dividing ratio of programmable frequency divider 9 while switching network 22 switches low-pass filter (LPF) 12, that is the capture range, according to the output signals of the AND circuit 20 and detuning detection circuit 21 where filter 12 comprises narrow range LPF 12' and wide range LPF 12".

The operation of the synthesizer tuner of FIG. 4 is as follows. The PLL circuit controls the oscillation frequency of voltage controlled oscillator 3 by changing the frequency dividing ratio of programmable frequency divider 9 with digital signals, and by controlling this oscillation frequency, the receiving frequency of the synthesizer tuner changes. In addition, the output analog voltage of the D/A converter 23 with the above-mentioned digital signals as an input is converted by circuit 24 to match the input voltage versus frequency characteristic curve of voltage controlled oscillator 3 and the output voltage controls the phase of the output of voltage controlled oscillator 3. Therefore, when the frequency of voltage controlled oscillator 3 is controlled from the free-running frequency to the positive or negative direction as described above, a phase error voltage is generated in the output of the phase sensitive detector 10. However, the phase of the oscillation frequency of voltage controlled oscillator 3 is controlled by the output voltage of the converter 24 and the phase difference between the two input signals applied to phase sensitive detector 10 is reduced. Thus, the phase error voltage is automatically controlled at near zero volts in the entire range of the receiving band.

When desired signals are received, the IF signals outputted from intermediate frequency amplifier 5 are applied to AND circuit 20 as "1" signals via Schmidt circuit 15. Further, when desired signals are received, the DC voltage from FM detector 6 becomes zero volts. Thus, "1" signals are supplied to AND circuit 20 via M-conversion circuit 16, Schmidt circuit 17 and inverter 18 as well. Hence, when desired signals are received, the logic of AND circuit 20 is established and "1" signals are applied to switching network 22. As a result, low-pass filter 12 is switched to a narrow capture range (LPF 12') by switching network 22. Since the phase error voltage is controlled at near zero as described above, the lock of the PLL circuit does not come off even when the capture range is narrowed.

On the other hand, when detuning occurs by changing the oscillation frequency of voltage controlled oscillator 3 by changing the frequency dividing ratio of programmable frequency divider 9, the detuning is detected by detuning detection circuit 21 by detection of changes in the least significant digit of the above-mentioned digital control signal. And, when detuning is detected, a control signal from detuning detection circuit 21 is applied to switching network 21, which switches and low-pass filter 12 is switched to a wide capture range (LPF 12"). This switching state continues until "1" signals output are again outputted from AND circuit 20.

Thus, in the FIG. 4 embodiment, the means for controlling the phase error voltage automatically at about zero is comprised of D/A converter 23 and conversion circuit 24. However, other means for effecting this function can be employed. Also Schmidt circuit 19, M-conversion circuit 16, Schmidt circuit 17, and inverter 18 comprise the detection circuits for the reception of desired signals. Other means are also readily conceivable for the detection circuits.

In summary with respect to the FIG. 4 synthesizer tuner, the phase error voltage is automatically controlled at near zero volts in the entire range of the receiving band where low-pass filter 12 is switched to a narrow capture range when receiving desired signals. Thus, the S/N can be substantially improved without concern that the PLL lock may be disconnected.

The D/A converter 23 and conversion circuit 24 of the FIG. 4 circuit may generally be used with any PLL to improve the performance of the associated voltage controlled oscillator. Thus, when a PLL circuit such as that of FIG. 4 is used, the performance of voltage controlled oscillator 3 can be improved by converting the digital signals for changing the frequency dividing ratio of programmable frequency divider 9 to analog voltage by D/A converter 23, converting the analog voltage to match the characteristic curve of the input voltage versus frequency of the voltage control oscillator 1 with conversion circuit 24 and controlling the phase of the oscillation frequency of the voltage controlled oscillator 3 with that output voltage. As stated above, when the foregoing is employed in a synthesizer tuner, it can improve the S/N.

Figure 5:
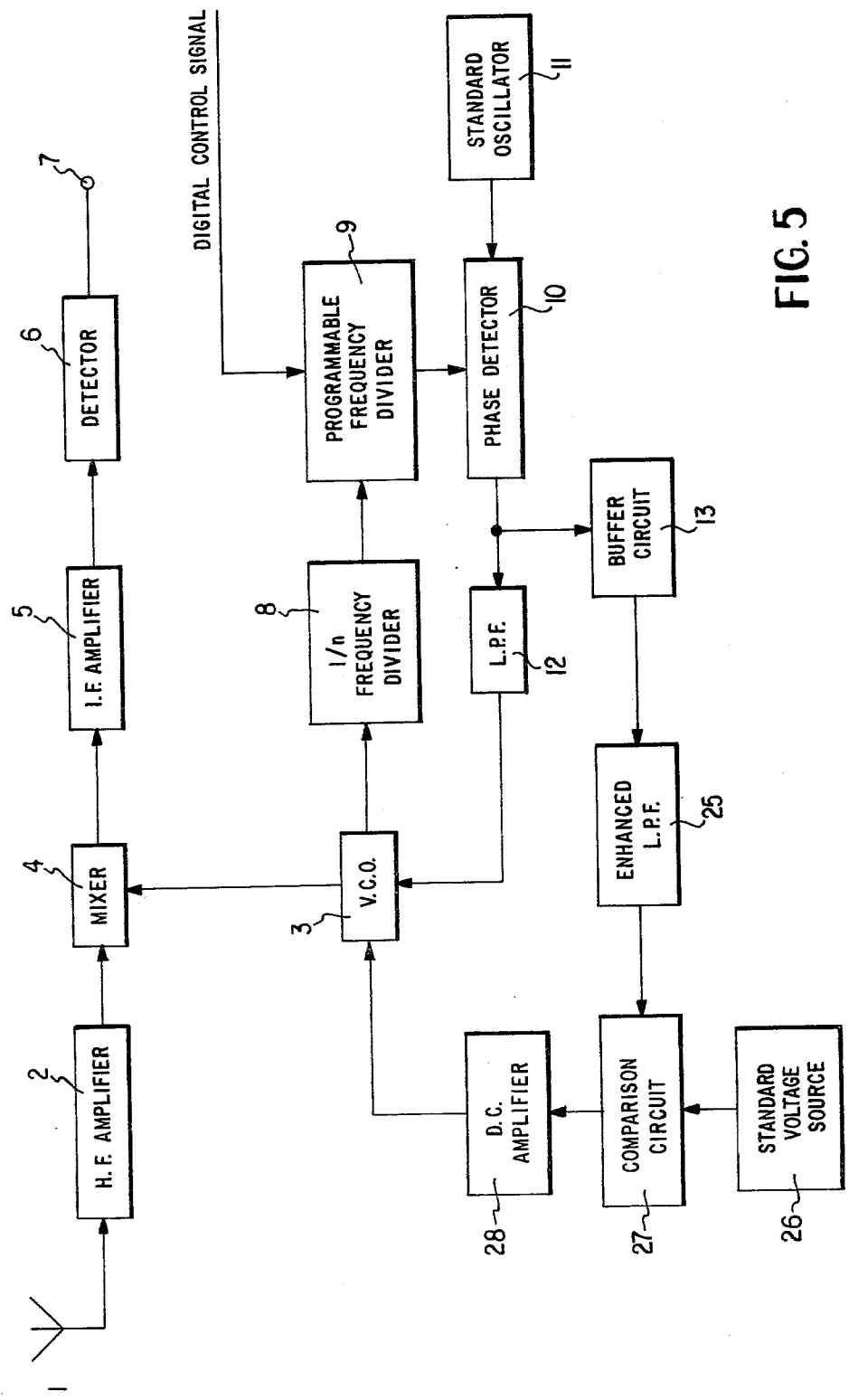

As stated hereinbefore, ripple components that cannot be integrated by low-pass filter 12 contribute to performance deterioration of voltage controlled oscillator 3 and S/N deterioration in the case of its use in a synthesizer tuner. Accordingly, another embodiment for overcoming this problem is illustrated in FIG. 5 where the following components are added to the basic PLL circuit where the PLL circuit of this invention is typically comprised of some or all the added components. The phase error voltage from the phase sensitive detector 10 output is applied to buffer circuit 13 and thence to a low-pass filter 25. Low-pass filter 25 is enhanced in its filtering action compared to low-pass filter 12 and can sufficiently dampen the ripple components. Therefore, DC voltage ripple components are more dampened at the output of low-pass filter 25 than at the output of low-pass filter 12. This DC voltage is applied to a comparison circuit 27 along with a standard voltage from a standard voltage generator 26. Standard voltage generator 26 generates a reference voltage of the same level as the voltage that would be outputted from phase sensitive detector 10 when the phase difference between the two signals applied thereto is zero. Thus, it is generally zero volts. This standard voltage and the DC output voltage of low-pass filter 25 are compared by comparison circuit 27 and the differential voltage between the two is amplified by a DC amplifier 28 and then applied to the frequency variable element of voltage controlled oscillator 3 where the phase of the output signal thereof is controlled. The oscillation frequency phase of the voltage controlled oscillator 3 is thus so controlled that the phase difference of the two frequencies applied to phase sensitive detector 10 is reduced—that is, the phase error voltage of the phase sensitive detector 11 output approaches zero volts and the DC output voltages of low-pass filters 12 and 25 also approach zero volts. Therefore, the ripple component of the phase sensitive detector 10 output also decreases whereby the performance of voltage controlled oscillator 3 is improved. In the case of a synthesizer tuner, the S/N is improved in the entire range of the receiving band.

Also, in the PLL circuit of this invention as described above, the lock does not come off when the reception frequency is being changed by the control signals supplied to programmable frequency divider 9 because the basic PLL response is sufficiently fast and normal operation can be maintained. After the desired station is received, the oscillation signal phase is controlled by the delayed comparison circuit 27 output so that the phase error voltage of phase sensitive detector 10 output becomes zero volts. Thus, the ripple component of the differential output voltage of comparison circuit 27 is much smaller than the DC output voltage of low-pass filter 12 in the basic PLL whereby the improvements of C/N and S/N are as described above.

In summary, when the PLL circuit of FIG. 5 is used, the phase error voltage is extracted from the basic PLL without influencing this loop, and this voltage is converted to DC voltage by low-pass filter 25 with the enhanced filtering action. This DC voltage and the standard voltage are compared by comparison circuit 27. The amplified, differential voltage then controls the phase of voltage controlled oscillator 3 so that the above-mentioned phase error voltage approaches zero volts. Thus, even when the phase difference between the two signals applied to phase sensitive detector 10 is large, the performance of voltage controlled oscillator 3 can be improved. When it is employed as the local oscillator of a synthesizer tuner, the S/N of the tuner can be improved in the entire range of the receiving band.

What is claimed is:

1. In a synthesizer tuner having a phase-locked loop circuit for a voltage controlled local oscillator where the frequency of the local oscillator output signal is divided by a programmable frequency divider and then compared with a standard frequency signal source by a phase detector, the phase detector output being applied to a low-pass filter means to derive a first DC control signal having a ripple component for controlling the frequency of the voltage controlled local oscillator, the improvement comprising
control means for producing a second DC control signal for further controlling the phase of the said local oscillator output signal so that the phase difference between the signals compared by said phase detector is reduced, said ripple component is lessened and the S/N ratio of the tuner is improved.

2. A tuner as in claim 1 where the phase difference between the signals compared by said phase detector is substantially zero at the free-running frequency of said local oscillator, said free-running frequency corresponding to a predetermined frequency within the receiving band of said tuner and where said control means reduces said phase difference to approximately said zero value.

3. A tuner as in claim 2 where said predetermined frequency is near the center of said receiving band.

4. A tuner as in claim 1 including indicating means for indicating said phase difference and where said control means is manually operable to effect the reduction in said phase difference, the said reduction being indicated by said indicating means.

5. A tuner as in claim 4 where said indicating means includes means responsive to said first DC control signal.

6. A tuner as in claim 4 where said low-pass filter means includes means for passing first and second frequency ranges where said first frequency range is narrower than said second frequency range and where said tuner includes reception detection means for detecting when the said reception frequency is being received by the tuner and detuning detection means for detecting when the tuner is being detuned and switching means responsive to said reception detection means and said detuning detection means for switching said low-pass filter means to said first frequency range when said reception frequency is being received and to said second frequency range when said tuner is detuned.

7. A tuner as in claim 6 including means for detecting when said phase difference between the signals being compared by said phase detector is reduced to a predetermined value, said switching means being further responsive to said last-mentioned means to switch said low-pass filter means to said first frequency range when said reception frequency is being received and when said phase difference has been reduced to said predetermined value.

8. A tuner as in claim 1 where said programmable frequency divider is responsive to a frequency control signal which determines the desired reception frequency of the tuner and where said control means for the local oscillator is responsive to said frequency control signal to produce said second DC control signal.

9. A tuner as in claim 8 where the magnitude of said second DC control signal is such that it oscillates said local oscillator at a frequency corresponding to the said reception frequency determined by said frequency control signal.

10. A tuner as in claim 8 where said low-pass filter means includes means for passing first and second frequency ranges where said first frequency range is narrower than said second frequency range and where said tuner includes reception detection means for detecting when the said desired reception frequency is being received by the tuner and detuning detection means for detecting when the tuner is being detuned and switching means responsive to said reception detection means and said detuning detection means for switching said low-pass filter means to said first frequency range when said reception frequency is being received and to said second frequency range when said tuner is detuned.

11. A tuner as in claim 1 where said programmable frequency divider is responsive to a frequency control signal which determines a desired reception frequency of the tuner and where said low-pass filter means includes means for passing first and second frequency ranges where said first frequency range is narrower than said second frequency range and where said tuner includes reception detection means for detecting when the said reception frequency is being received by the tuner and detuning detection means for detecting when the tuner is being detuned and switching means responsive to said reception detection means and said detuning detection means for switching said low-pass filter means to said first frequency range when said reception frequency is being received and to said second frequency range when said tuner is detuned.

12. A tuner as in claim 11 including means for detecting when said phase difference between the signals being compared by said phase detector is reduced to a predetermined value, said switching means being further responsive to said last-mentioned means to switch said low-pass filter means to said first frequency range when said reception frequency is being received and when said phase difference has been reduced to said predetermined value.

13. A tuner as in claim 1 where said control means includes a further low-pass filter responsive to said phase detector which is capable of filtering said ripple component better than the low pass filter which derives the first DC control signal to thereby pass a further DC control signal having a further ripple component less than that associated with the first DC control signal and deriving means for deriving said second DC control signal from said further DC control signal.

14. A tuner as in claim 13 where said deriving means includes a reference voltage generator for producing a reference voltage and a differential comparing means for producing said second DC control voltage as the difference between the reference voltage and the further DC control signal.

15. A tuner as in claim 14 where the magnitude of said reference voltage is approximately equal to the magnitude of the output of the said phase detector when the phase difference of the signal applied thereto is zero.

16. A tuner as in claim 1 where said programmable frequency divider is responsive to a frequency control signal which determines the reception frequency of the tuner and where the magnitude of said second DC control signal is such that it oscillates said local oscillator at a frequency corresponding to the said reception frequency determined by said frequency control signal.

17. In a phase-locked loop circuit having a voltage controlled oscillator where the frequency of the oscillator output signal is divided by a programmable frequency divider and then compared with a standard frequency signal source by a phase detector, the phase detector output being applied to a low-pass filter means to derive a first DC control signal having a ripple component for controlling the frequency of the voltage controlled local oscillator, the improvement comprising
  means for producing a second DC control signal for further controlling the phase of the said oscillator output signal so that the phase difference between the signals applied to said phase detector may be reduced and said ripple component lessened.

18. A circuit as in claim 17 where the phase difference between the signals compared by said phase detector is substantially zero at a free-running frequency of said voltage controlled oscillator and where said control means reduces said phase difference to approximately said zero value.

19. A circuit as in claim 17 where said programmable frequency divider is responsive to a frequency control signal for the voltage controlled oscillator and where said control means is responsive to said frequency control signal to produce said second DC control signal.

20. A circuit as in claim 19 where the magnitude of said second DC control signal is such that it oscillates said voltage controlled oscillator at the frequency determined by said frequency control signal.

21. A circuit as in claim 17 where said control means includes a further low-pass filter responsive to said phase detector which is capable of filtering said ripple component better than the low pass filter which derives the first DC control signal to thereby pass a further DC control signal having a further ripple component less than that associated with the first DC control signal and deriving means for deriving said second DC control signal from said further DC control signal.

22. A circuit as in claim 21 where said deriving means includes a reference voltage generator for producing a reference voltage and a differential comparing means for producing said second DC control voltage as the difference between the reference voltage and the further DC control signal.

23. A circuit as in claim 22 where the magnitude of said reference voltage is approximately equal to the magnitude of the output of the said phase detector when the phase difference of the signal applied thereto is zero.

24. A circuit as in claim 17 where said programmable frequency divider is responsive to a frequency control signal for the voltage controlled oscillator and where the magnitude of said second DC control signal is such that it oscillates said voltage controlled oscillator at the frequency determined by said frequency control signal.

* * * * *